United States Patent [19]

Hang

[11] Patent Number: 5,487,049
[45] Date of Patent: Jan. 23, 1996

[54] PAGE-IN, BURST-OUT FIFO

[75] Inventor: Chia-Lun Hang, San Jose, Calif.

[73] Assignee: Samsung Semiconductor, Inc., San Jose, Calif.

[21] Appl. No.: 344,758

[22] Filed: Nov. 23, 1994

[51] Int. Cl.$^6$ .................. G11C 7/00; G11C 8/00
[52] U.S. Cl. .......... 365/221; 365/235; 365/38.5; 365/239
[58] Field of Search ............... 365/238.5, 221, 365/230.01, 233, 239, 235

[56] References Cited

U.S. PATENT DOCUMENTS 4,873,666  10/1989  Lefebvre ............... 365/221 X
5,267,191  11/1993  Simpson ............... 365/221 X
5,274,600  12/1993  Ward ..................... 365/221
5,327,393   7/1994  Koyanagi ............... 365/233

*Primary Examiner*—David C. Nelms
*Assistant Examiner*—Son Mai
*Attorney, Agent, or Firm*—Townsend and Townsend and Crew

[57] ABSTRACT

A page in, burst-out FIFO buffer that stores only words in a single page and transfers the words to a DRAM utilizing a page mode transfer to increase data throughput and decrease latency offloading DRAM bandwidth.

3 Claims, 2 Drawing Sheets

PAGE-IN, BURST-OUT FIFO

BACKGROUND OF THE INVENTION

A shared bus system generally includes a DATABUS, ADRBUS, and CONTROLBUS, with the operation of the system following a protocol. An address transferred on the ADRBUS selects one of several devices coupled to the bus and the transfer of data between the selected device and the bus is controlled by control signals such as R/W and a system clock.

Most shared bus systems will include a memory such as a Dynamic Random Access Memory (DRAM) to store data. In addition to transferring data to and from the DATABUS the DRAM may have other functions which limit its availability to the BUS system. Thus, the BUS system may be ready to write data to the DRAM when the DRAM is not available As is well-known in the art, FIFOs are useful for buffering data. By using a FIFO, no data are lost if the DRAM isn't ready to receive each word when the BUS system is ready to transfer.

When data is stored in the FIFO it asserts a request signal (DRAMREQ) that is serviced by the DRAM as soon as it becomes free of other duties. If the FIFO write clock is based on the bus protocol and the FIFO read clock is based on RAM availability, then the FIFO will be read whenever one word of data is stored if the read clock is faster than the write clock. However, transferring one level of data from the FIFO to the DRAM does not take advantage of the increased transfer rate available if the page mode of the DRAM is utilized. For the transfer of a single word, the time for servicing a DRAMREQ is equal to the non-page mode access time of the DRAM and the system operates at a slow rate.

SUMMARY OF THE INVENTION

The present invention is a FIFO interface between a system bus and a DRAM that transfers data to the DRAM utilizing the high speed page mode. According to one aspect of the invention, words transferred having the same row address are accumulated in a store and then transferred to the DRAM utilizing the page mode to reduce the transfer time.

According to another aspect of the invention, the words stored in FIFO are transferred to the DRAM when the row address of a next word to be stored changes so that the page mode transfer can be utilized.

According to another aspect of the invention, data from a second page can be written to the FIFO while data from a current page is transferred to the DRAM utilizing the page mode.

According to another aspect of the invention, data from the same page can be stored without storing row addresses thereby reducing the complexity of the circuit.

Other advantages and features of the invention will become apparent in view of the following detailed description and appended drawings.

DESCRIPTION OF THE PREFERRED EMBODIMENT

Figure 1:
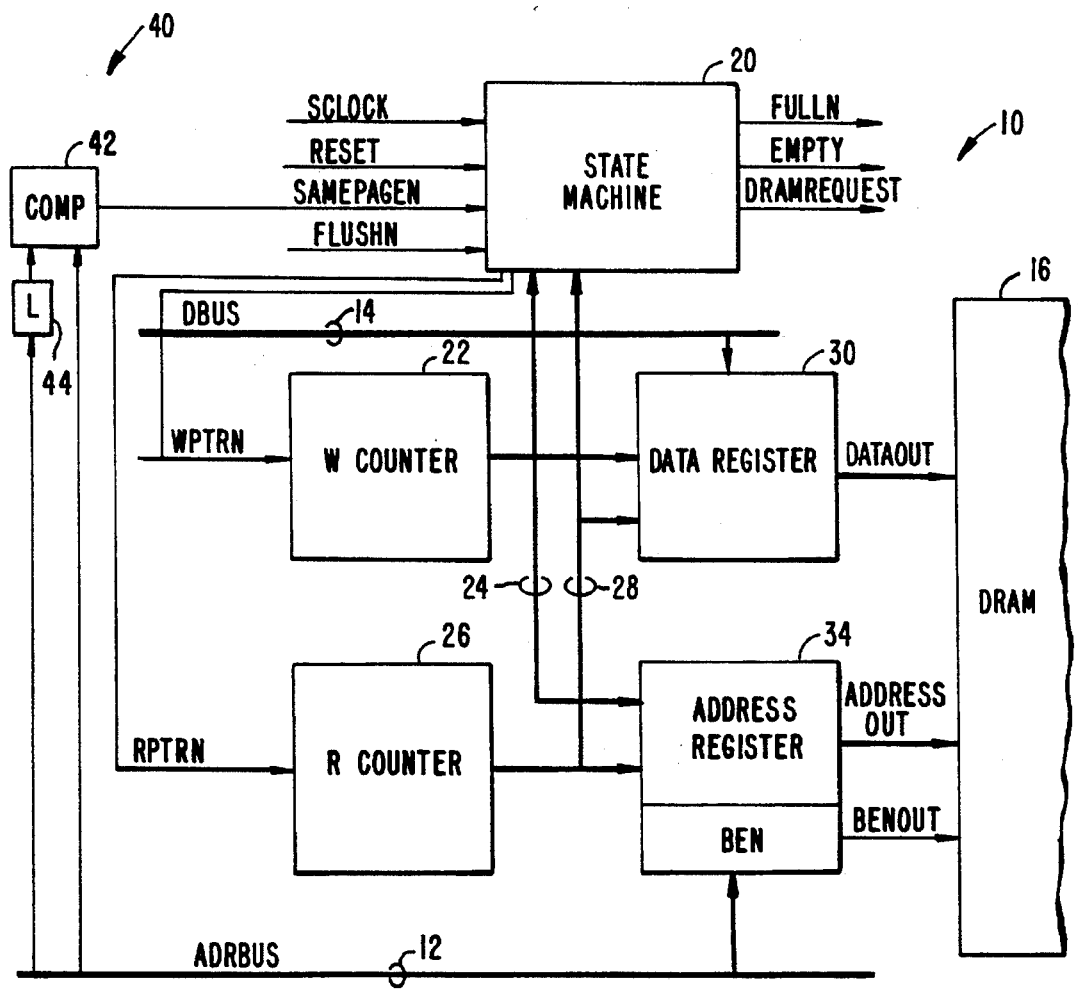
FIG. 1 is a block diagram of a preferred embodiment of the invention.

FIG. 1 is a block diagram of a preferred embodiment of the invention. The following table is a glossary of the names of signals utilized in the system:

TABLE 1

| INPUT SIDE: | |
|---|---|
| SCLOCK: | system clock. |
| RESET: | clears all registers and counters at start of operation. |
| SAMEPAGEN: | a signal that is asserted when the row address of a next word is the same as the row address of a current word. |
| WPTRN: | write pointer asserted by the state machine when a word is to be written to the data register, also called write-clock because it clocks data to the FIFO. |
| RPTRN: | read pointer asserted by the state machine when a word is to be read from the data register, also called read-clock because it clocks data from the FIFO. |
| DI: | data in bus. |
| WAD: | address in bus. |
| IBEN: | inputs bus enable signal, indicates which byte on 4-byte bus is selected. Part of address. |
| FLUSHN: | asserted when all data is to be read from the data register if SAMEPAGEN is deasserted to indicate that stored data should be read before new page data is stored. |
| OUTPUT SIDE: | |
| FULLN: | indicates that FIFO is full. Asserted either when 1) SAMEPAGEN is deasserted to indicate that stored data should be read before new page data is stored or 2) when the WCNT catches the RCNT indicating that if more data is written it will over-write data that has not yet been read. |
| EMPTY: | indicates the FIFO is empty. Asserted when the RCNT catches the WCNT to indicate that all stored data has been read. |
| DO: | data out bus. |
| WADO: | address out bus. |
| OBEN: | byte enable out bus. |
| DRAMREQN: | asserted when the value of the WCNT exceeds the value of the RCNT by a preset value. |
| INTERNAL SIGNALS | |
| WCNT: | the count value output by the write counter. The value is incremented by WPTRN and cleared by RESET. |
| RCNT: | the count value output by the read counter. The value is incremented by RCPTRN and cleared by RESET. |

In FIG. 1 a page-in, burst-out (PIBO) FIFO 10 interfaces a SYSTEM BUS including a SYSTEM ADDRESS BUS (ADRBUS) 12 and a SYSTEM DATA BUS (DBUS) 14 and a DRAM 16. Status and control signals to be described below are transferred between the PIBO FIFO 10 and DRAM and SYSTEM BUS controllers (not shown). In FIG. 1 data paths and control and status signals input to a state machine 20 are depicted. The various control lines utilized to effect the functions described below are not depicted to simplify the diagram and because the implementation of such control functions is well-known in the art.

The PIBO FIFO 10 is designed to decrease the latency of data transfers between a system bus and DRAM by utilizing the page-mode write cycle of the DRAM. As is well-known, page mode cycles are about 3.5 times as fast as normal mode write cycles. Page mode is implemented by holding the row address strobe clock (RAS) active while cycling the column address clock (CAS). The initial cycle is a normal cycle followed by shorter CAS cycles.

A state machine 20 receives CLOCK, RESET, SAMEPAGEN, and FLUSHN signals as inputs and provides FULLN, EMPTY, and DRAMREQ signals as outputs. It also provides control signals to control the counters and registers to perform the functions described below. A write counter (WCTR) 22 has its output port coupled to a WRITECOUNTBUS 24 and it input coupled to receive a write pointer (WPTRN) signal. A read counter (RCTR) 26 has its output port coupled to a READCOUNTBUS 28 and its input port coupled to receive a read pointer (RPTRN) signal.

A data register 30 has its input data port coupled to the DBUS 14, its data output port coupled to a data input port of the DRAM, its write address port coupled to the WRITECOUNTBUS 24 and its read address port coupled to READCOUNTBUS 28. An address register 34 has its input data port coupled to the ADRBUS 12, its data output port coupled to an address port of the DRAM, its READ address port coupled to the READCOUNTBUS 28 and its WRITE address port coupled to the WRITECOUNTBUS 24. The state machine 20 has inputs coupled to the WRITECOUNTBUS 24 and READCOUNTBUS 28.

A SAMEPAGEN signal generator 40 includes a comparator 42 having a first input coupled to the address bus, a second input coupled to the output of a row address latch 44, and an output for generating the SAMEPAGEN signal.

Figure 2:
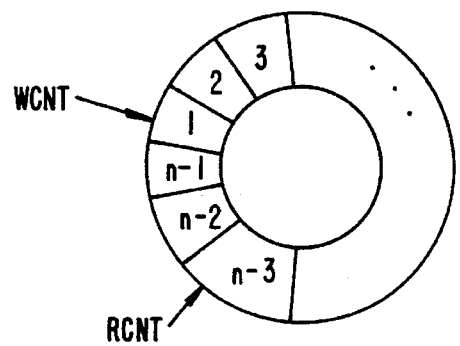
FIG. 2 is a schematic diagram of a FIFO.

The function of the WCNT and RCNT signals output, respectively, from the write counter 22 and read counter 26 will now be described with reference to FIG. 2. FIG. 2 symbolically depicts the data register as a circular file with WCNT pointing a slot to be filled during a write operation and RCNT pointing to a slot to be emptied during a read operation. RCNT and WCNT are incremented by the RDPTR and WPTR signals, respectively, which are derived from a system clock provided by the system bus controller and a read clock. If RCNT catches WCNT, then all slots are emptied and the state machine 20 asserts the EMPTY signal. Conversely, if WCNT catches RCNT, then all slots are filled and the state machine 20 asserts the FULL signal. If FULL were asserted and another word were written to the data register 30, then data not yet read would be overwritten and lost.

Additionally, it is apparent that if RPTRN is clocked at a rate that is faster than WPTRN, then as soon as a word is written to the slot indicated by WCNT it will be read when RCNT increments so that single words are transferred from the data register 30 to the DRAM utilizing the slow normal write cycle. Further, since data is typically transferred word by word the row and column addresses of each word stored in a FIFO must be stored.

The present system stores a preset number of words having the same row address before reading the words from the data register 30. Since the words all have the same row address the page mode write cycle of the DRAM is utilized to increase the speed of the transfer. The system is advantageous in environments such as graphics applications, where large amounts of data from the same page are transferred from the SYSTEM BUS to the DRAM. In a preferred embodiment, the state machine 20 asserts the DRAMREQ signal when the WCNT exceeds the RCNT by 8 words.

Figure 3:
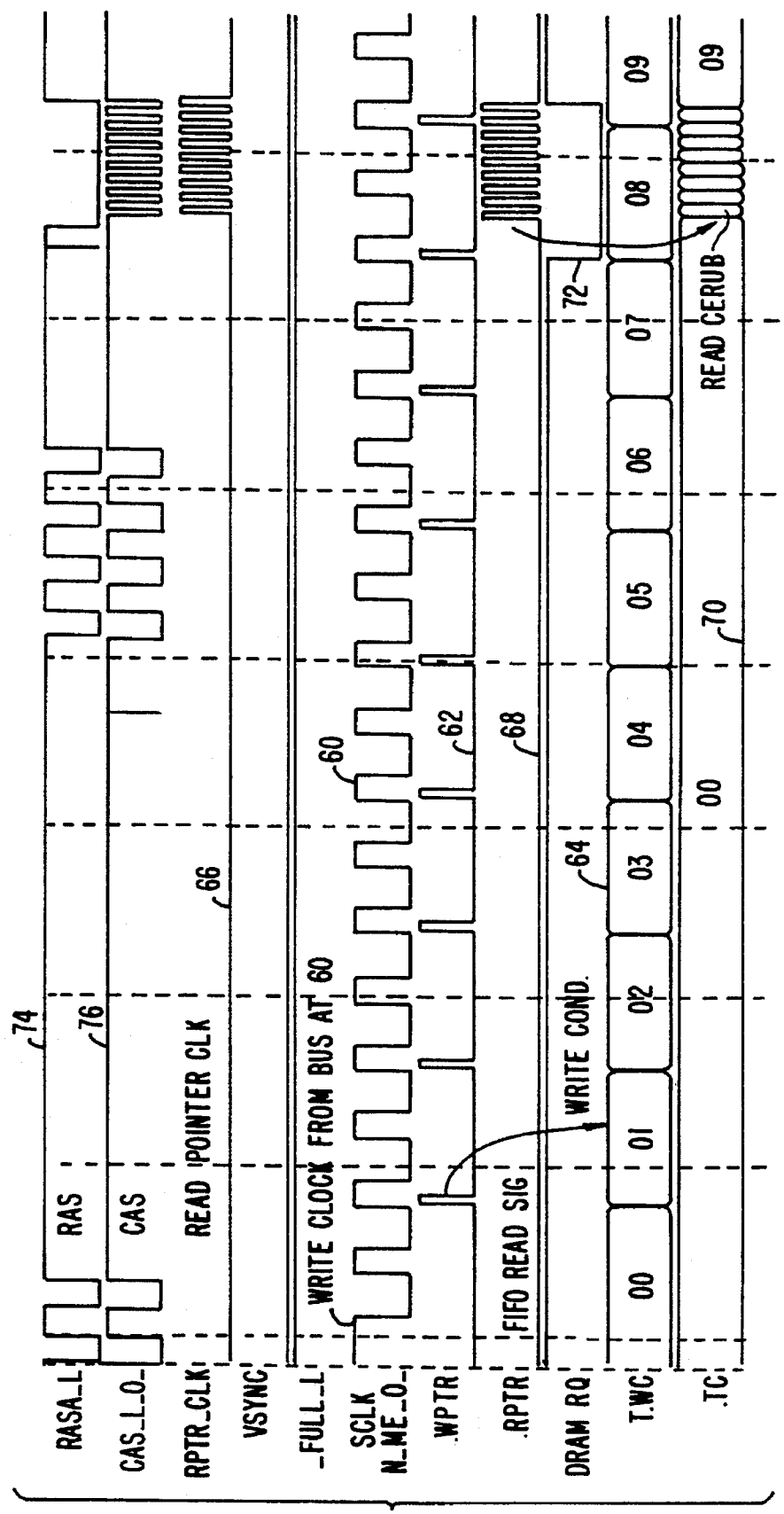
FIG. 3 is a timing diagram illustrating the operation of a preferred embodiment.

FIG. 3 is a timing diagram for the page mode transfer. In a preferred embodiment the data register 30 and address register 34 are two-port memories which can simultaneously write data to a storage location having an address specified by WCNT while reading data from a different storage location having an address specified by RCNT.

The SCLOCK signal 60 is supplied by an AT bus controller. In this example, data is being written to the data register 30 at a constant rate indicated by the WPTR signal 62 which is derived from SCLOCK 60. Thus, the WCNT signal 64 increases in value at a constant rate from an initial value of 00. A read clock signal 66 is generated by the state machine 20 and is supplied as the RPTR 68. Also, in the example, the value of RCNT 70 is initially 00. When WCNT 64 exceeds RCNT 70 by a predetermined value (in this case 08), the DRAMREQ signal 72 is asserted and, after a predetermined time, the RPTR 68 signal is generated to increment RCNT from 00 to 08 at a high page mode rate. RAS and CAS 74 and 76 signals are generated by the DRAM controller and derived from DRAMREQ 72 and the RPTR 68 signals to read the data output by the data register 30 utilizing the page mode to access storage locations specified by row addresses output by the address register 34.

As WCNT 64 is incremented, data is written from the DBUS 12 into the data register 30 at a storage location specified by WCNT while the corresponding column address is written from the ADRBUS 12 into the address register 34 at a storage location specified by WCNT 64. When WCNT is equal to 08 eight words in the same page have been stored in the data register 30. At that time the state machine 20 asserts DRAMREQ 72 and generates eight RPTR pulses 68 to increment RCNT from 00 to 08 while DRAMREQ is asserted to output the eight words previously stored in the data register 30 to the data input of the DRAM and to output the eight column addresses previously stored in the address register 34 to the address input of the DRAM.

The DRAM controller asserts RAS 74 for a predetermined amount of time when DRAMREQ 72 is received and pulses CAS 76 at the page mode rate to write the eight words output from the data register 30 at column locations specified by the eight addresses output by the address register 32. The row address for the eight words is supplied from the row address register 44. Note that the WCNT is incremented to 09 while the data is being output so that there is no latency with respect to writing data while data is being read from the PIBO FIFO 10.

The operation of the system when the row address changes will now be described. When SAMEPAGEN is asserted the state machine 20 operates as above-described and asserts DRAMREQ when WCNT exceeds RCNT by a predetermined amount. However, if SAMEPAGEN is deasserted to indicate a new row address on the ADRBUS 12 then the state machine 20 asserts FULLN to block incoming data until the PIBO 10 becomes empty and asserts FLUSHN to transfer all data stored in the data register to the DRAM. If more than one word is stored in the data register 30 then a page mode transfer is initiated.

Referring to FIG. 1, the ADRBUS 12 is coupled to the inputs of the row address latch 44 and comparator 42. Utilizing standard bus control signals, the comparator 42 compares a current row address stored in the row address latch 44 with a next row address provided by the ADRBUS 12 while a word having the current address is being stored in the data register 30. If the next row address is different from the current row address then the comparator deasserts SAMEPAGEN to transfer all data for the current row from the data register 30 to the DRAM while simultaneously writing data for the next row to the data register 30.

The invention has now been described with reference to the preferred embodiments. Alternatives and substitutions will now be apparent to persons of skill in the art. Accordingly, it is not intended to limit the invention except as provided by the appended claims.

What is claimed is:

1. A FIFO system for interfacing a system bus, including an address bus and a data bus, to a DRAM, with the DRAM operating in a normal access mode and a page mode, with data transferred at a higher page mode rate in the page mode, and with each storage location in the DRAM specified by a row address and a column address, said system comprising:

a data register having an input coupled to said data bus and an output coupled to a data input of the DRAM;

an address register, having an input coupled to said address bus and an output coupled to an address input of the DRAM;

a write control unit, coupled to said data and address registers, for writing page data having a first row address into said data register and writing column addresses of said page data into said address register; and a read control unit, coupled to said data and address registers, for initiating a read operation to provide said page data to the data input of said DRAM and said column addresses to the address input of said DRAM at the page mode rate when the number of page data stored in said data register exceeds a predetermined number; and a page change detection unit, coupled to said address bus and said read control unit, for initiating a read operation when a second row address transmitted on said address bus is different from the first row address of the page data stored in said data register.

2. The system of claim 1 wherein said page change detection unit comprises:

a row address latch, having an input coupled to said address bus, for latching said first address;

a comparator, having a first input coupled to an output of said row address latch, a second input coupled to said address bus to receive a second address transmitted on said bus, and an output for asserting a read operation initiation signal when said first and second addresses are not the same.

3. A FIFO system for interfacing a system bus, including an address bus and a data bus, to a DRAM, with the DRAM operating in a normal access mode and a page mode, with data transferred at a higher page mode rate in the page mode, and with each storage location in the DRAM specified by a row address and a column address, said system comprising:

a data register having an input coupled to said data bus and an output coupled to a data input of the DRAM;

an address register, having an input coupled to said address bus and an output coupled to an address input of the DRAM;

a write control unit, coupled to said data and address registers, for writing page data having a first row address into said data register and writing column addresses of said page data into said address register;

a read control unit, coupled to said data and address registers, for initiating a read operation to provide said page data to the data input of said DRAM and said column addresses to the address input of said DRAM at the page mode rate when the number of page data stored in said data register exceeds a predetermined number; and a write counter, having an input coupled to receive a write clock signal including a series of write pulses and an output for providing a write count value to said data and address register, for incrementing a write count value when a write pulse is received, where said data register writes data to a location specified by said write count value and said address register writes a column address to a location specified by said write count value; and wherein said read control unit comprises:

a read counter, having an input coupled to receive a read clock signal including a series of read pulses and an output for providing a read count value to said data and address register, for incrementing a read count value when a read pulse is received, where said data register reads data from a location specified by said read count value and said address register reads a column address from a location specified by said read count value.

* * * * *